United States Patent [19]

Phillips

[11] 4,156,809

[45] May 29, 1979

[54] DATA ACQUISITION SYSTEM

[75] Inventor: David T. Phillips, Santa Barbara, Calif.

[73] Assignee: The United States of America as represented by the United States Department of Energy, Washington, D.C.

[21] Appl. No.: 875,822

[22] Filed: Feb. 7, 1978

[51] Int. Cl.² .................. H04B 9/00; G01R 13/04
[52] U.S. Cl. .................. 250/199; 250/227; 324/113
[58] Field of Search .................. 324/111–113; 250/199, 227, 338

[56] References Cited
U.S. PATENT DOCUMENTS

| 3,147,380 | 9/1964 | Buckingham | 250/338 |
| 3,573,615 | 4/1971 | Porat | 324/111 |
| 3,697,757 | 10/1972 | Stone | 250/199 |
| 3,840,738 | 10/1974 | Indig | 250/199 |
| 3,867,627 | 2/1975 | Nelson | 250/199 |

Primary Examiner—Howard W. Britton
Attorney, Agent, or Firm—Dean E. Carlson; John A. Koch

[57] ABSTRACT

A data acquisition system capable of resolving transient pulses in the subnanosecond range. A pulse in an information carrying medium such as light is transmitted through means which disperse the pulse, such as a fiber optic light guide which time-stretches optical pulses by chromatic dispersion. This time-stretched pulse is used as a sampling pulse and is modulated by the signal to be recorded. The modulated pulse may be further time-stretched prior to being recorded. The recorded modulated pulse is unfolded to derive the transient signal by utilizing the relationship of the time-stretching that occurred in the original pulse.

22 Claims, 4 Drawing Figures

DATA ACQUISITION SYSTEM

BACKGROUND OF THE INVENTION

The invention described herein was made in the course of Contract No. EY-76-C-08-1183 with the U.S. Energy Research and Development Administration (now the Department of Energy). This invention relates to data acquisition systems and more particularly to a data acquisition system which can provide subnanosecond resolution of transient pulses of bandwidth greater than one gigahertz and having a dynamic range on the order of 1,000:1.

Obtaining detailed information on extremely fast, singly occuring, transient signals is of interest in a number of fields. In the field of testing nuclear explosives, analysis of electrical pulses generated by nuclear radiation sensitive detectors is of critical importance in the evaluation of the performance of the explosive.

It has been common practice in the nuclear explosive testing field to transmit transient electrical signals of this general type over coaxial cables and utilize high-speed, single-transient, recording oscilloscopes to record the signals. However, the coaxial cable-oscilloscope combination is presently limited to a resolution on the order of about 2 nanoseconds (ns) and, therefore, unsatisfactory for recording pulses of subnanosecond duration.

In view of the foregoing, I have discovered a fast data acquisition system that is capable of providing resolution of transient pulses of less than a nanosecond in duration.

SUMMARY OF THE INVENTION

Accordingly, it is an object of the invention to provide a high-speed data acquisition system which is capable of recording single transient signals in the subnanosecond range. Briefly, summarized, this is accomplished by generating a pulse of short duration in an information carrying medium, time-stretching that pulse, modulating the time-stretched pulse with the transient signal to be recorded, spreading the modulated pulse, and recording the spread, modulated pulse. The transient signal can thereafter be unfolded from the recorded pulse by utilizing the relationship of the time-stretching that occurred in the time-stretching step and the spreading of the modulated pulse.

A particularly advantageous application of the invention utilizes an optical pulse to acquire transient electrical signals in the subnanosecond range. The time-stretching of the optical pulse before and after its modulation with the transient signal may be accomplished through the use of fiber optic light guides. These fibers exhibit chromatic dispersion, $\Delta t$, given by $$\Delta t = (L/c)(\Delta\lambda/\lambda)D_c \tag{1}$$

where L is the fiber length, c is the velocity of light in vacuum, $\Delta\lambda$ is the spectral width of the sampling pulse centered at the wavelength $\lambda$, and $D_c$ is the dispersion coefficient. For fused silica guides typical of "low-loss guides" in current premium commercial production, the dispersion coefficient is approximately:

$D_c = 0.065$ at $\lambda = 550$ nm.
$= 0.03$ at $\lambda = 800$ nm.
$= 0.01$ at $\lambda = 1060$ nm.

Thus, for green light ($\lambda = 550$ nm.) the chromatic dispersion will be approximately 4 ns/km for a spectral width, $\Delta\lambda$, of 10 nm.

That chromatic dispersion characteristic of the fiber permits a light pulse, which is initially subnanosecond in duration, to arrive as a sampling pulse at an electro-optical cell over a period of several nanoseconds with the faster-moving components of the spectral bandwidth included in the initial pulse arriving first. Therefore, modulating the sampling optical pulse with the transient electrical pulse converts the transient signal into an optical pulse which is essentially time-coded by wavelength.

Transmission of the modulated optical pulse over a second light guide accomplishes a further spreading of that pulse and widening of the time scale. As will be shown hereinafter, the modulated pulse is stretched by a factor of $(L_2/L_1)+1$, where $L_1$ is the length of the first fiber and $L_2$ is the length of the second.

It can be seen, then, that a time-stretching of optical pulses can be utilized to permit very fast pulses to be recorded on state-of-the-art recording devices. For example, a 2-ns recording system, such as a photomultiplier-high speed oscilloscope combination, could be utilized to record a 0.2-ns pulse with the selection of the lengths $L_2$ and $L_1$ to provide a ratio of 9:1.

The duration of this sampling pulse at the electro-optical modulator would be limited by the spectral width of the initial pulse and the length of $L_1$. For example, a spectral width of 120 nm in the green would provide a 10-ns sampling window for a length of $L_1$ of 200 m.

Additional objects and advantages and a better understanding of the invention will be apparent after consideration of the following description of a preferred embodiment thereof.

DESCRIPTION OF A PREFERRED EMBODIMENT

Figure 1:
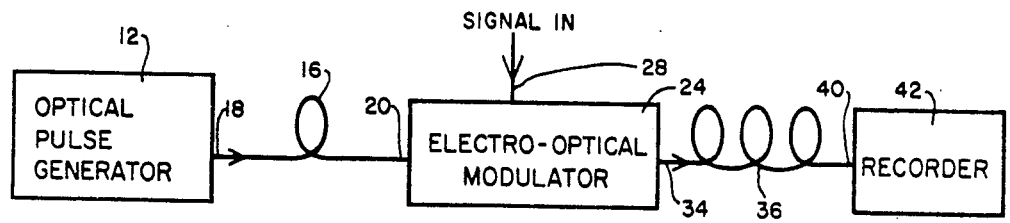
FIG. 1 is a block diagram illustrating the functional components of a preferred embodiment.
Figure 2:
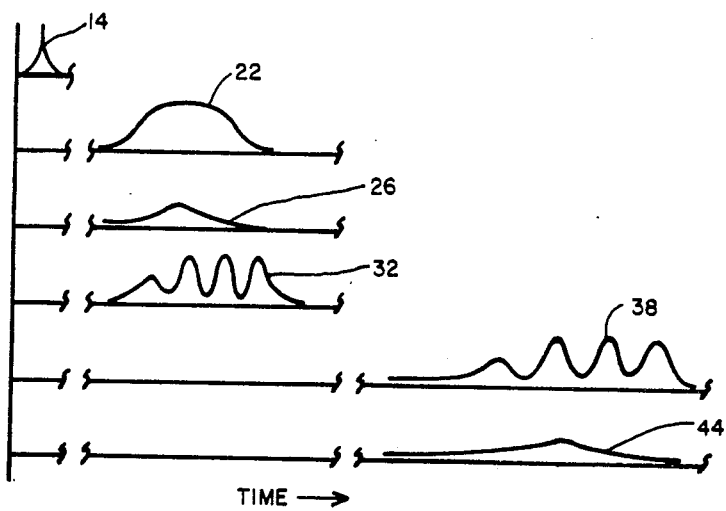
FIG. 2 is graphical representation of the various pulses generated in connection with the operation of a preferred embodiment.

Referring now to FIGS. 1 and 2 of the drawing, optical pulse generator 12 generates a subnanosecond pulse 14 which is shown in FIG. 2. The other pulses shown in FIG. 2 will be identified as the description of the apparatus of FIG. 1 unfolds. Pulse 14 is introduced into a length $L_1$ of fiber optic wave guide 16 at first end 18. Chromatic dispersion of initial pulse 14 takes place as the pulse travels the length of guide 16 to the other end 20 to form the time-stretched sampling pulse 22. Sampling pulse 22 is directed across electro-optical modulator 24 wherein it is modulated by electrical signal pulse 26 to which the modulator is subjected at 28.

The output from modulator cell 24, then, is a modulated light pulse 32 which is introduced into first end 34 of a second length of fiber optic wave guide 36. Further chromatic dispersion of modulated light pulse 32 takes place in guide 36 as it proceeds down the length thereof to produce time-stretched modulated pulse 38 at the other end 40. Pulse 38 is then recorded by recorder 42 and thereafter unfolded to produce the time-stretched signal pulse 44 from which the original signal pulse 26 can be derived.

As indicated earlier, modulated sampling pulse 22 is time-stretched in guide 36 by the factor $(L_2/L_1)+1$ where $L_1$ is the length of guide 16 and $L_2$ is the length of second guide 36. The derivation of this factor follows.

For light of wavelength $\lambda$, the transit time, $t_\lambda$, through a length, $L$, of fiber with a group index of refraction at $\lambda$ of $N(\lambda)$ is $$t_\lambda = \frac{L}{c} N(\lambda) \tag{2}$$

where c is the velocity of light in a vacuum. Measuring time from the occurrence of the short light pulse 14, the time interval between the wavelengths $\lambda_1$ and $\lambda_2$ on modulated pulse 32 just leaving the modulator, i.e., just entering waveguide 36, is $$\begin{aligned}\Delta t_m &= \frac{L_1}{c} N(\lambda_2) - \frac{L_1}{c} N(\lambda_1) \\ &= \frac{L_1}{c} [N(\lambda_2) - N(\lambda_1)]\end{aligned} \tag{3}$$

The corresponding time between the same two wavelengths on the modulated pulse 38 just arriving at the recorder 42, i.e., just leaving waveguide 36, is $$\begin{aligned}\Delta t_r &= \frac{L_1 + L_2}{c} N(\lambda_2) - \frac{L_1 + L_2}{c} N(\lambda_1) \\ &= \frac{L_1 + L_2}{c} [N(\lambda_2) - N(\lambda_1)]\end{aligned} \tag{4}$$

The time-stretch is the ratio $\Delta t_r / \Delta t_m$ or $$\frac{\Delta t_r}{\Delta t_m} = \frac{L_1 + L_2}{L_1} = \frac{L_2}{L_1} + 1 \tag{5}$$

Therefore, the recorded signal 38 follows the modulated optical pulse 32 with a time expansion factor of $(L_2/L_1)+1$.

There is additionally an amplitude correction factor due to the optical spectrum of the source 14 and the spectral dependence of the group index of refraction which is given by the power spectrum of the source 14 divided by the absolute value of the derivative of the group index with respect to wave number. There may be additional chromatic effects in the electro-optical modulator 24, also. These factors are determined experimentally during calibration of the system.

Now with respect to more specific aspects of individual elements of the described embodiment, the best choice of optical pulse generator 12 would be one which produces a fast, high-power, broad-band light pulse of subnanosecond duration. Peak power of 100 watts, a spectral bandwidth of 100 nm, and a pulse duration of a tenth of a nanosecond or less would be very desirable. System bandwidth is limited by the duration of optical pulse 14 and modal plus other small dispersions in optical waveguide 16. The length of the sampling pulse 22 is determined by the spectral width of initial pulse 14 and the length of first optical waveguide 16. For example, from equation (1), a sampling window of about 10 ns would be produced by a subnanosecond light pulse 14 having a spectral width of 120 nm in the green with a length of waveguide 16 of 200 m.

Pulses 14 of a few tens of picosencond duration, although generally of somewhat narrow bandwidth, can be produced by mode-locked lasers. The phenomenon of "super-broadening" in water can yield optical pulses of a few tens of nanoseconds duration and broak spectral bandwidth. Other approaches to obtaining a sampling pulse 22 of appropriate characteristics for a particular application will be apparent to those skilled in the art.

With respect to fiber optic light guides 16 and 36, it is important in this application that the guides have minimum optical pulse dispersions other than the desired chromatic dispersion. In particular, modal dispersion, caused by different propagation velocities of the various modes supported in the light guide, should be small compared to chromatic dispersion. Accordingly, single-mode light guides would be quite suitable for this application. Alternatively, advantage can be taken of a manufacturing technique, now well developed, wherein the optical index of fraction is made to vary transversely across the core of multi-mode guides in a manner which approximately equalizes the propagation volocity of the various modes. Such so-called graded index fiber could also be advantageously used in this application. In addition, the guides could be assembled into a rugged cable to ease handling proglems in field experiements. Light guides with these desired features are commercially available from several manufacturers including Corning Glass Works, International Telephone and Telegraph, and American Optical Corporation. As noted before, calibration of a particular guide or type of guide to a particular optical pulse generator will be necessary.

The modular 24 may take a variety of forms including various types of electro-optical modulators, as mentioned herein; acoustic-optical modulators, which are typically slower than electro-optical types but have lower driving power requirements and are widely available commercially; or even direct radiation-optical modulators utilizing the solvated electron effect. These last are presently developmental devices, but have potential for very high-speed modulation.

Among useful electro-optical modulators, Pockel's cells are commercially available which are very fast; however, this type of device has a rather limited dynamic range. A Kerr cell may be advantageously used as the electro-optical modulator. A traveling wave Kerr cell which provides a 1 percent measurement of subnanosecond signals over a 1000:1 dynamic range has been described in U.S. Pat. No. 3,867,627 to Melvin A. Nelson, Terence J. Davies, and John C. Clark. Pulse 32 is representative of the output of such a Kerr cell, operated such that its transfer function is given by $$f(t) = A \sin^2 \frac{\pi}{2} \left[ \frac{V(t) - V_B}{V_m} \right]^2 \tag{6}$$

where V(t) is electrical input signal 26, f(t) is modulated optical output 32, $V_B$ is a bias voltage across the Kerr cell, $V_m$ is the so-called half-wave voltage which is determined by the Kerr cell design, and A is an arbitrary scale factor depending upon the amplitude of sampling optical pulse 22.

Figures 3, 4:
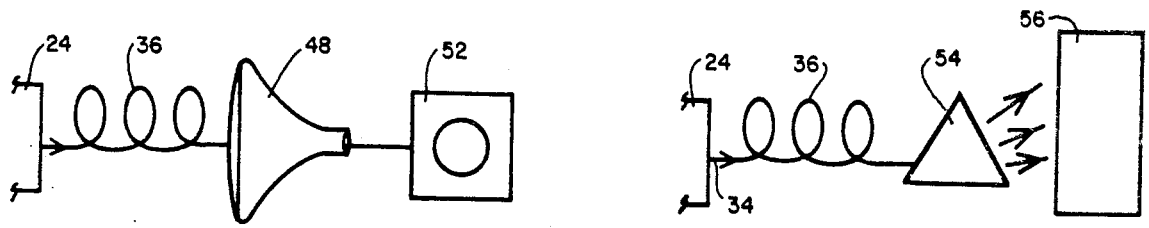
FIGS. 3 and 4 illustrate alternative recorder combinations for the preferred embodiment of FIG. 1.

FIGS. 3 and 4 illustrate two particular alternatives for recorder 42 in FIG. 1. Identical reference characters are used to identify identical components in these three figures. In FIG. 3, the recording function is performed by a combination of a photomultiplier 48 and a high-speed, recording oscilloscope 52. The resolution of the photomultiplier-oscilloscope combination is generally considered to be about 2 ns. However, the system, in accordance with the invention, permits utilization of that combination in recording signals in the subnanosecond range.

With reference to FIG. 4, since the optical signal 32 entering end 34 of light guide 36 has been encoded both in time and in wavelength, demodulation may be accomplished by using a dispersive element 54, such as a grating or prism, and an optical integrating recording device 56 such as photographic film, a vidicon camera tube, or a photodiode array, as examples. Dispersive element 54 spatially spreads and separates the output light for the recording. Signal pulse 26 can then be readily derived from the recorded data. In this embodiment, the wavelength to time encoding is established entirely by light guide 16, and the length of light guide 36 is not material to the basic operation of the system.

While the foregoing description of preferred embodiments are directed to the use of optical pulses as the information carrying medium, it will be appreciated that other embodiments using other information carrying media are possible within the scope of the invention as expressed in the appended claims. The use of electromagnetic waves other than optical waves and the use of acoustic waves come readily to mind. Accordingly, while the fundamental novel features of the invention have been shown and described and pointed out as applied to embodiments particularly described, it will be readily appreciated by those skilled in the art that various omissions, substitutions, and/or changes may be made within the principle and scope of the invention as expressed in the appended claims.

What I claim is:

1. In a data acquisition system, the apparatus comprising:
   a. Means for generating an information carrying medium,
   b. Means for dispersing said medium in time according to some physical parameter of the medium,
   c. Modulator means for modulating said dispersed medium by the data to be acquired, and
   d. Means for recording said dispersed, modulated medium.

2. The apparatus according to claim 1 including means for further dispersing said dispersed, modulated information carrying medium prior to recording.

3. The apparatus according to claim 1 wherein the information carrying medium generated by said means is a wave.

4. The apparatus according to claim 3 wherein said wave is an electromagnetic wave.

5. The apparatus according to claim 4 wherein said electromagnetic wave is of optical wavelengths.

6. The apparatus according to claim 5 wherein said means for dispersing said optical wave is a length of fiber optic waveguide.

7. The apparatus according to claim 6 including means for further dispersing said modulated optical wave.

8. The apparatus according to claim 7 wherein said means for further dispersing said modulated optical wave is a second length of fiber optic waveguide.

9. The apparatus according to claim 7 wherein said means for further dispersing said modulated optical wave is a grating.

10. The apparatus according to claim 7 wherein said means for further dispersing said modulated optical waveguide is a prism.

11. The apparatus according to claim 8 wherein said recording means include a photomultiplier and an oscillosocpe.

12. The apparatus according to claim 9 wherein said recording means include an optical integrating device.

13. The apparatus according to claim 10 wherein said recording means include an optical integrating device.

14. The apparatus according to claim 6 wherein said modulating means is an electro-optical modulator.

15. The apparatus according to claim 14 wherein said modulator is a Kerr cell.

16. In a data acquisition system, the method comprising:
   a. Generating an information carrying medium,
   b. Dispersing said medium in time according to some physical parameter of the medium,
   c. Modulating said dispersed medium by data to be acquired, and
   d. Recording said dispersed, modulated medium.

17. The method of claim 16 including the step of further dispersing said dispersed, modulated information carrying medium prior to recording.

18. The method of claim 16 wherein said information carrying medium is a wave.

19. The method of claim 18 wherein said wave is an electromagnetic wave.

20. The method of claim 19 wherein said electromagnetic wave is of optical wavelengths and said dispersing step is by chromatic dispersion.

21. The method of claim 16 wherein said information carrying medium is an optical pulse including at least two wavelengths and said dispersing steps are accomplished by chromatic dispersion.

22. The method of claim 21 wherein said two dispersing steps are accomplished by lengths $L_1$ and $L_2$, respectively, of fiber optic waveguides and including the step of unfolding the data to be acquired utilizing the relationship $$\frac{\Delta t_r}{\Delta t_m} = \frac{L_2}{L_1} + 1$$

where $\Delta t_m$ is the time interval between selected wavelengths as the optical pulse enters the second waveguide at $\Delta t_r$ is the time interval between said wavelengths as the optical pulse leaves the second waveguide.

* * * * *